United States Patent
Stuckey et al.

(10) Patent No.: US 10,672,578 B2
(45) Date of Patent: Jun. 2, 2020

(54) SOLID-STATE RELAY

(71) Applicant: David Stuckey Investments Pty Ltd, Melbourne (AU)

(72) Inventors: David Martin Stuckey, Hawthorn (AU); Brent Graham, Gabriola (CA); Michael Strike, Darley (AU); Tenry Kusuma Negara, Cikarang (ID)

(73) Assignee: DAVID STUCKEY INVESTMENTS PTY LTD, Melbourne (AU)

( * ) Notice: Subject to any disclaimer, the term of this patent is extended or adjusted under 35 U.S.C. 154(b) by 26 days.

(21) Appl. No.: 15/754,634

(22) PCT Filed: Aug. 25, 2016

(86) PCT No.: PCT/AU2016/000294
§ 371 (c)(1),
(2) Date: Feb. 23, 2018

(87) PCT Pub. No.: WO2017/031527
PCT Pub. Date: Mar. 2, 2017

(65) Prior Publication Data
US 2018/0254160 A1  Sep. 6, 2018

(30) Foreign Application Priority Data
Aug. 26, 2015 (AU) .................................. 2015903454

(51) Int. Cl.
*H01H 47/18* (2006.01)
*H03K 17/284* (2006.01)
(Continued)

(52) U.S. Cl.
CPC ......... *H01H 47/18* (2013.01); *G01R 31/3278* (2013.01); *H03K 17/284* (2013.01); *H03K 17/302* (2013.01); *H03K 17/785* (2013.01)

(58) Field of Classification Search
CPC .. H01H 47/18; G01R 31/327; G01R 31/3278; H03K 17/284; H03K 17/30; H03K 17/785; H02H 3/00
(Continued)

(56) References Cited

U.S. PATENT DOCUMENTS 4,044,272 A 8/1977 Darrow
4,059,845 A * 11/1977 Kolkman .............. B61L 13/002
361/198

(Continued)

FOREIGN PATENT DOCUMENTS

EP 0949734 A2 10/1999
EP 2584580 A1 4/2013
WO 2013033765 A1 3/2013

*Primary Examiner* — Rexford N Barnie
*Assistant Examiner* — Jagdeep S Dhillon
(74) *Attorney, Agent, or Firm* — The Webb Law Firm

(57) ABSTRACT

A programmable solid-state relay includes a base module; a configuration module; a control voltage module having an energy storage device; a controller module having at least two microcontrollers, each having an internal EEPROM memory and at least one digital timer; and at least one switch module including at least one switching circuit having first and second switching contacts. The control voltage module is adapted to receive an applied control voltage and to permit pre-selection of an activation voltage level and a de-activation voltage level.

22 Claims, 12 Drawing Sheets

(51) Int. Cl.
*H03K 17/30* (2006.01)
*H03K 17/785* (2006.01)
*G01R 31/327* (2006.01)

(58) Field of Classification Search
USPC ........ 307/140, 139, 138, 141; 361/1, 12, 33, 361/35, 31, 41–49
See application file for complete search history.

(56) References Cited

U.S. PATENT DOCUMENTS

| | | | |
|---|---|---|---|
| 4,276,483 A | 6/1981 | Hayden | |
| 4,351,014 A | 9/1982 | Schofield, Jr. | |
| 4,855,612 A | 8/1989 | Koga et al. | |
| 6,167,329 A | 12/2000 | Engel et al. | |
| 6,259,978 B1 * | 7/2001 | Feely | B61L 19/06 |
| | | | 246/167 R |
| 6,381,506 B1 * | 4/2002 | Grappone | G05B 9/03 |
| | | | 326/14 |
| 6,708,135 B2 | 3/2004 | Southworth et al. | |
| 7,961,030 B2 | 6/2011 | Ma | |
| 2004/0218317 A1 * | 11/2004 | Kawazu | G05B 19/058 |
| | | | 361/1 |
| 2012/0081824 A1 | 4/2012 | Narendra et al. | |
| 2012/0268074 A1 * | 10/2012 | Cooley | H01G 11/58 |
| | | | 320/130 |
| 2013/0249316 A1 | 9/2013 | Yeong et al. | |
| 2014/0242420 A1 * | 8/2014 | Schaffner | H01M 10/486 |
| | | | 429/9 |
| 2015/0256665 A1 * | 9/2015 | Pera | H04L 12/2803 |
| | | | 455/420 |
| 2015/0333377 A1 * | 11/2015 | Davila | H01M 10/425 |
| | | | 429/50 |

* cited by examiner

SOLID-STATE RELAY

CROSS-REFERENCE TO RELATED APPLICATIONS

This application is the United States national phase of International Application No. PCT/AU2016/000294 filed Aug. 25, 2016, and claims priority to Australian Patent Application No. 2015903454 filed Aug. 26, 2015, the disclosures of which are hereby incorporated in their entirety by reference.

BACKGROUND TO THE INVENTION

Field of the Invention

The invention generally relates to a solid-state relay. In particular, the invention relates to a digitally controlled programmable solid-state relay which may be used in railway applications. More particularly, the invention relates to a programmable solid-state relay, which may be used in retro-fitting an existing electromechanical relay. It will be convenient to hereinafter describe the invention in relation to this particular application. It should be appreciated however that the present invention is not limited to that application only.

Description of Related Art

Relays are used extensively in the railway industry for the propagation of electrical signals through the railway signalling system and time delay relays are similarly used to delay the propagation of those electrical signals for a pre-determined period of time.

Such time delay relays commonly in use by railway systems around the world are generally based upon a resistor-capacitor circuit ("RC circuit") time delay. A storage capacitor is charged to a pre-set level and then discharged through a resistor.

In an RC circuit, the value of the time constant in seconds is equal to the product of the circuit resistance in Ohms and the circuit capacitance in Farads, i.e. $\tau = R \times C$. $\tau$ is the time required to charge the capacitor, through the resistor, to 63.2% of full charge or to discharge it to 36.8% of its initial voltage.

Various delay circuits are known in the art. One approach by Ma, as disclosed in U.S. Pat. No. 7,961,030, uses delay circuits that include a resistor and a capacitor in series. The time delay is related to the resistance of the resistor and the capacitance of the capacitor.

In another approach by Darrow, which is disclosed in U.S. Pat. No. 4,044,272, a fail-safe time delay circuit for providing a time interval is similarly described. The time delay circuit includes a resistance-capacitance charging network, which is connected to a direct current ("DC") supply source by a switching device. The potential charge developed on the capacitor powers an inverter to produce alternating current ("AC") signals having a given frequency. The AC signal is then fed to a multi-stage tuned amplifier, having a resonant circuit tuned to the given frequency. The amplified AC signals are applied to a voltage doubling network, which normally energizes a load and which maintains the load energized for no longer than the definite time interval after the opening of the switching device.

Hayden, in U.S. Pat. No. 4,276,483, describes a timed switch utilizing a resistive capacitor relaxation oscillator. However, a drawback of this technique is that resistor and capacitor values are nominal only, which prevent an accurate prediction of the resultant time delay and circuits often require fine adjustments to achieve the desired time delay.

It has proved to be problematic in the art to develop practical RC circuits, which provide accurate and predictable timing, because the rate of current discharge from the capacitor is exponential rather than linear with time. Time delay relays typically utilize a fixed value capacitor and a variable resistor or potentiometer to select the desired delay period.

In practice, setting the time delay is usually one of trial and error. The methodology followed is to first set the potentiometer at some nominal value. The relay is then energized and the delay time is measured. The potentiometer is then adjusted, the relay reset and the delay time measured again. This process is repeated until the desired time delay is achieved or approximated.

A further drawback of the RC timing technique is that the values of these discrete components can be affected by both temperature and ageing.

One advantage offered by the present invention is that it does not rely upon the charge/decay rate of a timing capacitor to control the delay time. Further, the level of complexity, which was previously mandatory, has been substantially simplified.

Schofield, in U.S. Pat. No. 4,351,014 describes a fail-safe solid-state relay for AC devices, which employs triodes for alternating current ("TRIACs"). This approach cannot be applied to DC devices as the central component ("TRIAC") is limited to AC operation.

Koga et al., in U.S. Pat. No. 4,855,612, also provides a relay, which is operable to delay the transition of a plurality of switches using a capacitor as the timing means.

Existing electromechanical relays, such as those used by British Rail, for example, often experience a number of problems, such as high contact resistance, mechanical wear and tear, susceptibility to environmental conditions, variability of performance based on mechanical and material variation, for example, of the contact spring tension and the like.

In addition, non-time delay relays suffer from delays caused by their design. The present invention incorporates the use of a transistor or some other solid-state-based switching circuit instead of the mechanical-type contact. Further, the present inventors have surprisingly found that by retrofitting the present time delay relay to circuits employing existing electromechanical relays, the function of existing relays can be substantially emulated. In this way, the relay of the present invention offers the ability to detect component failures and thereby substantially prevent unsafe switch states from occurring.

A further issue is that there are occasionally temporary power interruptions, during which the voltage level supplied to the relay from an external power source is interrupted. This drop in voltage can sometimes cause a problem with the reliability of the relay.

The present invention seeks to overcome, or at least substantially ameliorate, at least some of the disadvantages and shortcomings of the prior art.

SUMMARY OF THE INVENTION

According to one form of the invention, there is provided a programmable solid-state relay comprising: a base module; a configuration module; a control voltage module comprising an energy storage device; a controller module having at least two microcontrollers, each comprising an internal EEPROM memory, and at least one digital timer; and at least one switch module comprising at least one switching circuit with first and second switching contacts, wherein the control voltage module is adapted to receive an applied control voltage and to permit pre-selection of an activation voltage level and a de-activation voltage level.

During use of the solid-state relay, generally when a control voltage is applied and this exceeds the pre-selected activation voltage level, a response to the polarity of the applied control voltage is generated and the at least one switching circuit is set to at least one individually pre-determined first state and the timer is loaded with a pre-determined value. The timer is then started, whereby at least one time delay is initiated, the expiry of which sets the at least one switching circuit to at least one individually pre-determined subsequent state.

Further, when the applied control voltage decreases to the pre-selected de-activation voltage level, a response is generated, whereby the timer is started to initiate at least one time delay the expiry of which sets the at least one switching circuit to at least one individually pre-determined subsequent state.

According to one form of the present invention, a first control voltage is applied and when this exceeds the pre-selected activation voltage level, a response to the polarity of the applied control voltage is generated and the at least one switching circuit is set to at least one individually pre-determined first state and the timer is loaded with a pre-determined value, whereafter the timer is started to initiate at least one time delay the expiry of which sets the at least one switching circuit to at least one individually pre-determined subsequent state. A second control voltage is then applied, whereafter the timer is loaded with at least one pre-determined time value, the expiry of which sets the at least one switching circuit to at least one individually pre-determined subsequent state.

In a preferred embodiment of the present invention, the at least one switching circuit is placed in a state, which is selected from at least one normally open switch or at least one normally closed switch, or combinations thereof. More preferably, the at least one switching circuit comprises at least two normally open switches connected in series.

In yet a further preferred form, the state of the at least one switching circuit comprises at least one normally open switch and one normally closed switch connected in series.

In yet a further preferred form, the state of the at least one switching circuit comprises at least two normally closed switches connected in parallel.

More preferably, the state of the at least one switching circuit comprises at least four normally closed switches connected in series parallel.

In a most preferred embodiment, the state of the at least one switching circuit is selected from up to sixteen sets of two normally open switches in series, or up to sixteen sets of two normally closed switches connected in parallel, or up to sixteen sets of a combination of two normally open switches in series and two normally closed switches in parallel.

For reliability purposes, there is at least one energy storage device located in the control voltage module of the relay to provide sufficient power to a portion of the microcontrollers, whereby when the applied control voltage decreases to a minimum voltage level, the ability of the microcontrollers to control the state of the normally open and/or normally closed switches is substantially maintained, even in the case of a temporary power interruption. In addition, the energy storage device acts as a power buffer to provide sufficient time for the microcontrollers to transition from the activation mode to the deactivation mode and accordingly, to shut down safely. The energy storage device is preferably selected from a supercapacitor or an alternative power source, such as one or more batteries.

In a preferred form, the programmable solid-state relay comprises at least one Ferroelectric Random Access Memory (FRAM) device located in the controller module, which is associated with each of the microcontrollers for permanent storage of data, wherein upon initialization of a software program used to control the relay, the contents of the internal EEPROM memory are copied to the FRAM device and substituted therefor during one or more subsequent operations of the program.

The programmable solid-state relay preferably further comprises a display module, which comprises at least one visual indicator/s selected from a light emitting diode/s, a multi-segmented display/s or a liquid crystal display/s, or combinations thereof. In one form of the invention, the display module displays the state of each of the at least one switching circuits, the control voltage level, the remaining time in the at least one digital timer, the overall state of the relay, and/or a combination thereof.

The control voltage is selected from DC or AC and the control voltage polarity is pre-selectable between polarity sensitive and polarity insensitive. In one form, the polarity is sensitive, whereby a biased relay is provided. In another form, the polarity is insensitive, whereby an unbiased relay is provided.

In a preferred form, the programmable solid-state relay of the present invention is used in combination with a slave device, wherein the slave device is selected from a relay, a signal, a computer, a motor or a bell, or a combination thereof.

The programmable solid-state relay of the present invention finds particular application in railway signalling and switching applications and is particularly suitable for use in a SIL4 signalling system. However, the present solid-state relay is not limited to such an application.

The present invention also extends to a method of installing the programmable solid-state relay of the invention in new railway signalling and switching applications, or for retrofitting existing railway signalling and switching applications, whereby at least two or more of the following: (i) at least one pair of suitable connections on the relay base to supply the control voltage; (ii) the desired number and combination of normally open and normally closed switches; (iii) the value of the activation voltage; (iv) the value of the de-activation voltage; (v) the sensitivity of the relay to the polarity of the activation voltage; (vi) the ability of the at least one switching circuit to retain its existing state upon removal of the activation voltage; and/or (vii) the value of the at least one time delay, are initially selected by the installer and then one or more levels of the at least two selected variables are set prior to removably attaching the relay to a suitably compatible existing railway signalling relay plugboard.

There is further a need to ensure that the high safety requirements of the overall signalling system are met and maintained in the production of new non-standard relays. The interchangeability requirements of RGS GK/RT0330 are met in Q style relays by mechanical means comprising a pattern of coding pins installed in the base of the relay with a matching pattern of receptacles in the plugboard. The pin code patterns for existing relays in Railway Group Standard GK/GN0630, require five-pin pin-codes for safety-critical equipment. The allocation of each pin-code pattern is unique to a particular application, thus preventing the connection of an item of equipment with a different functionality.

In another preferred form, the relay of the present invention further comprises a unique three-pin code installed in the base thereof, wherein the three pins are received in a matching pattern of three receptacles provided in a suitably compatible plugboard. In this way, when non-standard, customised relays are produced, incorrect connection of the relay to the plugboard is substantially prevented. This feature will provide substantial flexibility in the design of new relay types and functions without compromising the high safety requirements of the overall signalling system.

According to a further form of the invention, there may be provided a slow pick function, whereby the controller module sequentially loads and runs a timer with one or more time delay values. Upon each sequential expiry of the timer, the state of each of the at least one switches is set to a pre-determined state. It should be noted that there is no upper limit on the duration of the time delays.

According to a further form of the invention, there is provided a delayed release function, wherein when the applied control voltage decreases to the selected de-activation voltage level, the resetting of the at least one switches to their individually pre-determined first states is delayed by corresponding pre-determined time values.

According to a further preferred form of the invention, at least one of the at least two microcontrollers comprises an external communication means, whereby the relay transmits data, such as switch status data, to an external device or service. Preferably further, at least one of the at least two microcontrollers comprises a real time clock means.

According to a further form of the invention, the controller module includes a logging function, whereby the occurrence of a pre-determined event is recorded in the controller module.

According to a further form of the invention, there is provided a switch latching function, whereby the state of each of the at least one switches, once established in their active state, is retained in said active state for an indefinite length of time or until specified pre-requisite conditions are satisfied.

According to a further form of the invention, there is provided a method of operation using an installed software program of the programmable solid-state relay according to Claim 1, wherein the method comprises the steps of (i) reading and/or measuring an analogue level of an applied control voltage or current and converting it into a digital value; (ii) periodically and continuously monitoring the digital value of the control voltage or current and comparing it to one or more pre-set levels of the control voltage or current; and (iii) modifying the state of one or more switching circuits according one or more of the following: the measured value of the control voltage or current as required; the ability of the at least one switching circuits to retain its existing state upon removal of the activation voltage or current; or the instantaneous value of any time delay, whereby an unsafe state of the relay is substantially prevented.

Switching Circuit

Preferably further, the at least one switching circuit/s is in the form of a pair of optically isolated metal oxide semiconductor field effect transistors ("mosfets"), with the state of each member of said pair under the control of a separate controller, such that both of the said controllers must reach a consensus as to the correctness of the state of each member of said pair before setting the state of both members of said pair to their non-default state.

Where it is desired that the at least one switching circuit is in the form of a normally open switch, then said optically isolated mosfets are of the enhancement-mode type connected in series. Where it is desired that the at least one switching circuit/s is in the form of a normally closed switch, then said optically isolated mosfets are of the depletion-mode type connected in parallel.

Advantageously, the relay further comprises means for monitoring the state of the said optically isolated mosfets comprising the at least one switching circuit.

Display

Status indicators may be in the form of LEDs, which indicate the control voltage level. Status indicators are also additionally in the form of an array of LEDs, which indicate the state of each corresponding switching circuit as either active, inactive or failed.

Where a particular switching circuit is in its default state, a first colour is illuminated on the LED array at the location corresponding to that switching circuit. When the particular switching circuit enters its non-default state, a second colour is illuminated. Where a failure of the switching circuit has been detected, a flashing pattern is displayed. Different flashing patterns are also preferably used to further differentiate failure types.

Such status indicators are further preferably in the form of numeric or alphanumeric displays, which show the instantaneous value of the active timer, the relay type, nominal voltage and other values or parameters, as required.

Prior to commencement of any timer operation, the display will output the initial value of the timer. Upon commencement of timer operation, the display will substantially continuously output the current value of the timer.

Control Voltage Level

The nominal control voltage is preferably selectable from 12V, 24V or 50V depending on the application required in a particular jurisdiction. The voltage can be pre-determined prior to being supplied to the customer to suit the particular application required. The activation and de-activation voltage levels are pre-selectable as a subset of the nominal control voltage. The activation voltage level is generally preselected to be 8V, while the deactivation voltage level is generally preselected to be between 7 and 7.5V. The minimum voltage level required to operate the relay is 5V. Should the voltage drop below this minimum voltage level, the voltage level is supplemented by the energy storage device, such as a supercapacitor, to ensure reliable operating capacity of the processor.

Configuration Module

In a preferred form of the invention, the source of the selectable input voltage is selectable. One of the preferred embodiments of the present invention is to provide a "drop-in" replacement for existing electromechanical relays, where the activation voltage is presented on different pins of the plugboard. In order to maintain physical compatibility with these electromechanical relays, it is desirable to be able to select which of these pins will provide the control voltage for the present invention.

In order to effect this feature, the signals provided from the plugboard are brought to the configuration module, where the desired control voltage signals are selected and routed through to the power supply of the solid-state relay.

Similarly, as some existing electromechanical relays switch different pairs of connections on the plugboard, a similar mechanism is used to select which of these connections will be connected to the switches in the present invention.

Control Voltage Module

Electromechanical relays are generally available in two forms, namely, non-polarized or neutral relays, which only require a voltage potential between two control voltage pins, and polarized or biased relays, which require that a first specified control voltage pin must be positive with respect to a second specified control voltage pin. For example, with reference to FIG. 4, a neutral relay may only require a voltage to be present across pins R1_IN and R3_IN, whereas a biased relay may require that R1_IN must be positive with respect to R3_IN. Selection of neutral or biased operation is accomplished by the use of jumpers and diodes in the control voltage module, such that the control voltage signals are either routed though a full wave bridge rectifier to the voltage regulator circuit, which constitutes neutral operation, or via a pair of diodes, which prevent voltage of incorrect polarity from energizing the power supply which constitutes biased operation.

The energy storage device, such as a supercapacitor, is located in the control voltage module and provides temporary power to portions of the relay control logic enabling the relay to continue to function when the applied control voltage decreases below the minimum voltage level.

Switch Module

The switching circuits of the present invention provide a means of substantially preventing relay component failure from creating a deleterious condition in the overall system application.

The most serious deleterious condition is generally manifested where a failure causes a normally open switch to be closed when it should be open. This condition is substantially precluded in the present invention by the unique arrangement of a plurality of independently controlled mosfets comprising each solid-state switch. Should one of the normally open mosfets controlled by the first microcontroller fail in the closed state, the second microcontroller will substantially prohibit the other normally open mosfet from closing, thus maintaining the overall switch in the open state.

Failures which cause a normally closed switch to be open when it should be closed are similarly precluded by the second microcontroller maintaining the other normally closed mosfet in the closed state, thus maintaining the overall switch in the closed state.

Failures which cause a normally open switch to be open when it should be closed, or a normally closed switch to be closed when it should be open, are considered to be right-side failures and are substantially mitigated by the design of the overall signalling system and train operating rules. In all cases, detected switch failures are indicated on the display circuit.

Those skilled in the art will appreciate the strict requirements and regulations which govern railway signalling and switching applications in most jurisdictions around the world. One of the advantages offered by the present solid-state relay is that it provides a relay for ready and removable attachment to such existing plugboards.

It should be noted that any one of the aspects mentioned above may include any of the features of any of the other aspects mentioned above and may include any of the features of any of the embodiments described below, as appropriate. For example, while the relay is described as a voltage-operated device, it is equally possible to configure the relay as a current-operated device by measuring the voltage drop of the control voltage across a resistor using the analogue-to-digital converter feature of the controller module to derive a measurement of the control current. This will then determine the behaviour of the relay according to the level of the control current in a manner analogous to the method described herein for determining the behaviour of the relay, according to the level of the control voltage.

BRIEF DESCRIPTION OF THE DRAWINGS

The accompanying drawings, which are incorporated in and constitute a part of this Specification, illustrate various implementations of the invention and, together with the description, serve to explain the advantages and principles of the invention. In the drawings.

DESCRIPTION OF THE INVENTION

Figure 1:
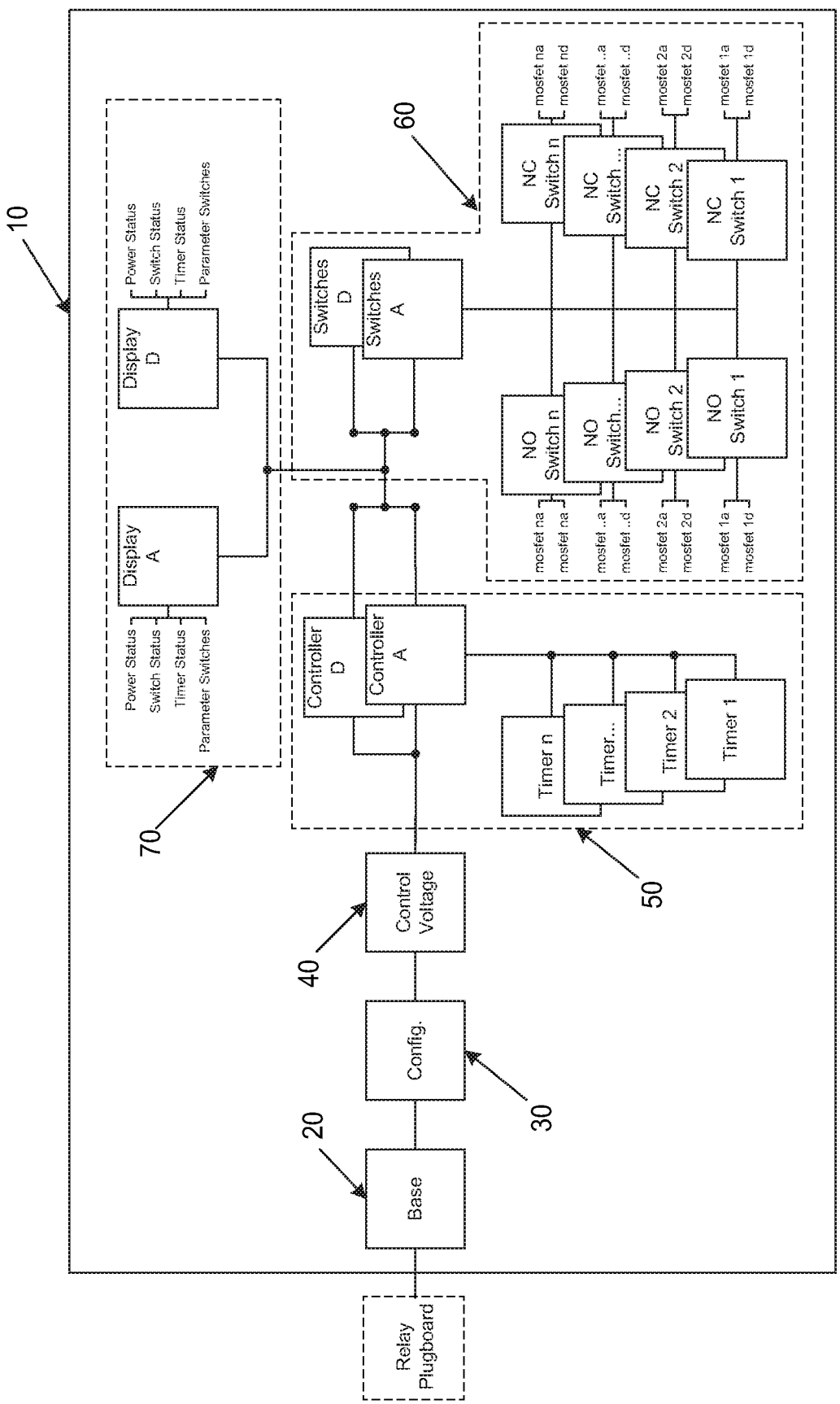
FIG. 1 is a block diagram of a solid-state relay according to a preferred embodiment of the invention.

The following detailed description of the invention refers to the accompanying drawings. Wherever possible, the same reference numbers will be used throughout the drawings and the following description to refer to the same and like parts. Dimensions of certain parts shown in the drawings may have been modified and/or exaggerated for the purposes of clarity or illustration.

The invention is used to control the propagation of an electrical signal. Various parameters, including parameters of one or more input signals are monitored and when these parameters satisfy pre-determined conditions, the state of one or more switches is set or reset for a pre-determined time, or until one or more parameters change to another pre-determined value.

Various indicia are provided to show the operating state of the switches.

Upon detection of a switch fault, the system is set to a known state and fault indicia are indicated.

The system is based around a control module having at least two microcontrollers to provide diversity, implement system logic and to provide high accuracy and repeatable timing and control.

The solid-state time-delay relay comprises a combination of hardware and software logic implemented in the operation of the controllers. Whilst the hardware supports the implementation of the software logic, it can and will be described herein in isolation from it.

The present invention provides for the implementation of up to two independent relays, i.e. single or dual relays. As the two relays are identical, only a single relay and the common circuitry will be detailed, where appropriate.

Where details regarding a dual relay are described, the two relays are referred to as relay A and relay D.

Referring to FIG. 1, which depicts a block diagram of one preferred embodiment of the solid-state relay of the present invention, the relay 10 comprises a base module 20, a configuration module 30, a control voltage module 40, a controller module 50, a switch module 60 and a display module 70.

Figure 2:
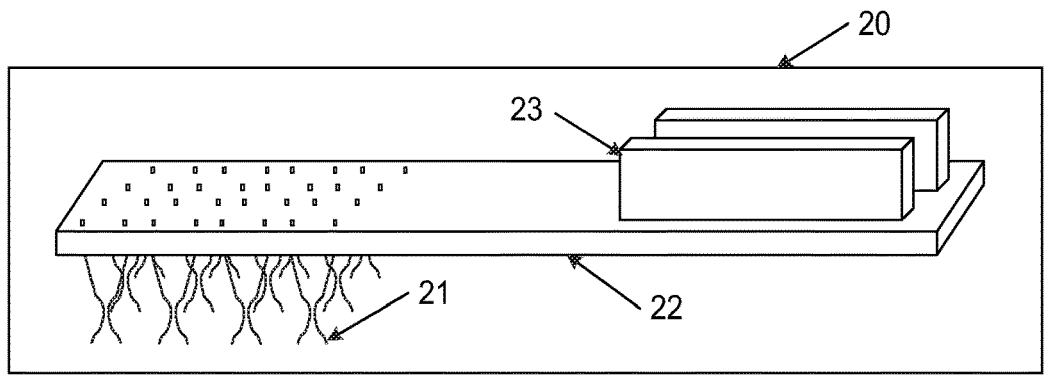
FIG. 2 illustrates a portion of the base module of the relay.

FIG. 2 depicts a portion of the base module 20 employed for installing the relay onto a plugboard and interfacing the railway industry connectors with electronic industry connectors. The base housing (not shown) is configured to mechanically mate with the plugboard. Signals present on the railway industry style connectors 21 are routed by the base printed circuit board 22 to electronic industry connectors 23.

Figure 3:
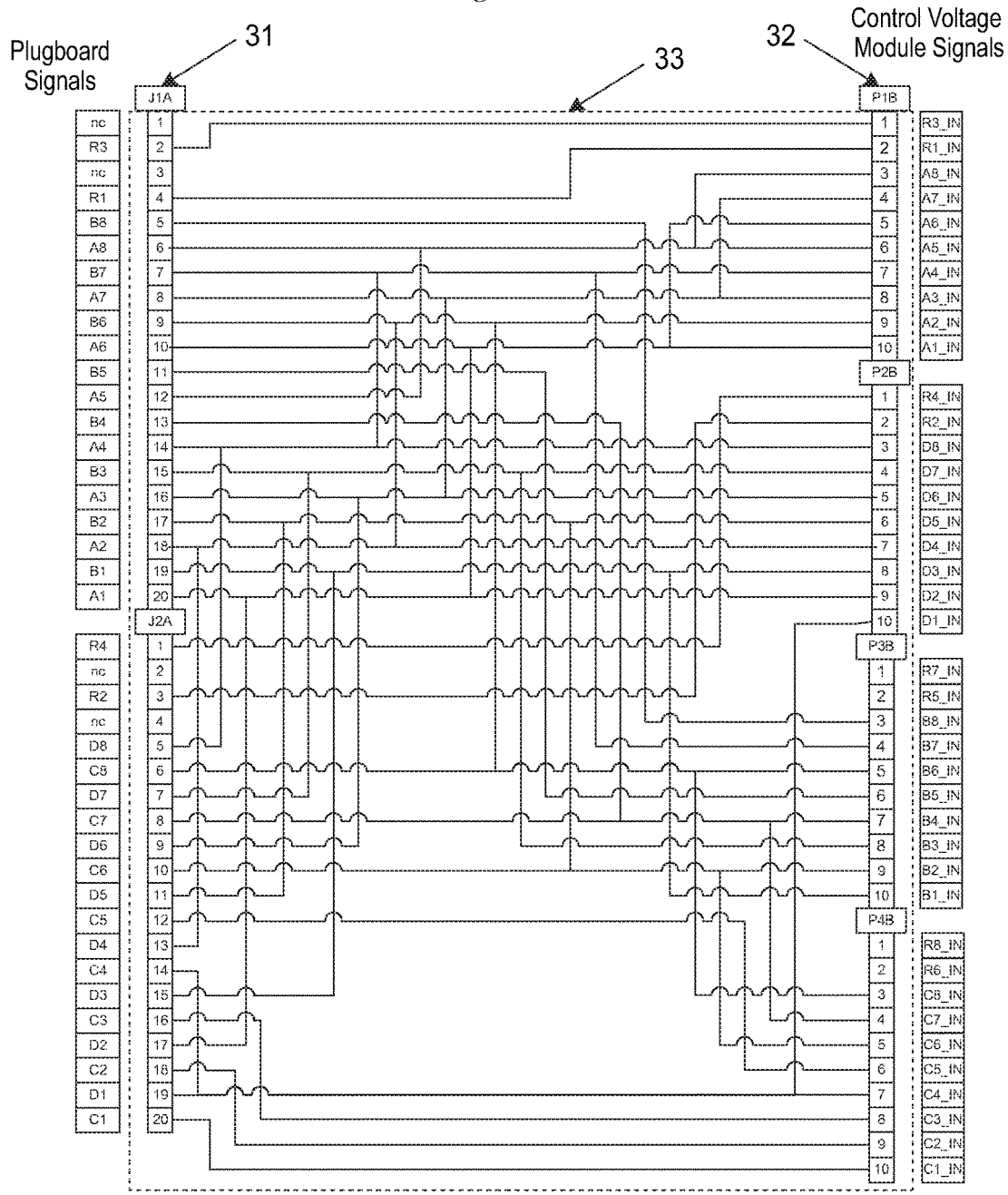
FIG. 3 illustrates a typical configuration module.

FIG. 3 depicts a typical configuration module, which functions to route the various plugboard signals present on the base module 31 to specified pins on the control voltage module 32 via the configuration module printed circuit board 33. Various configuration modules are available corresponding to the various plugboard pin assignments.

This arrangement allows for a consistent signal/pin naming convention to be implemented in the remaining modules, while maintaining plug compatibility with many existing electromechanical relays.

Figure 4:
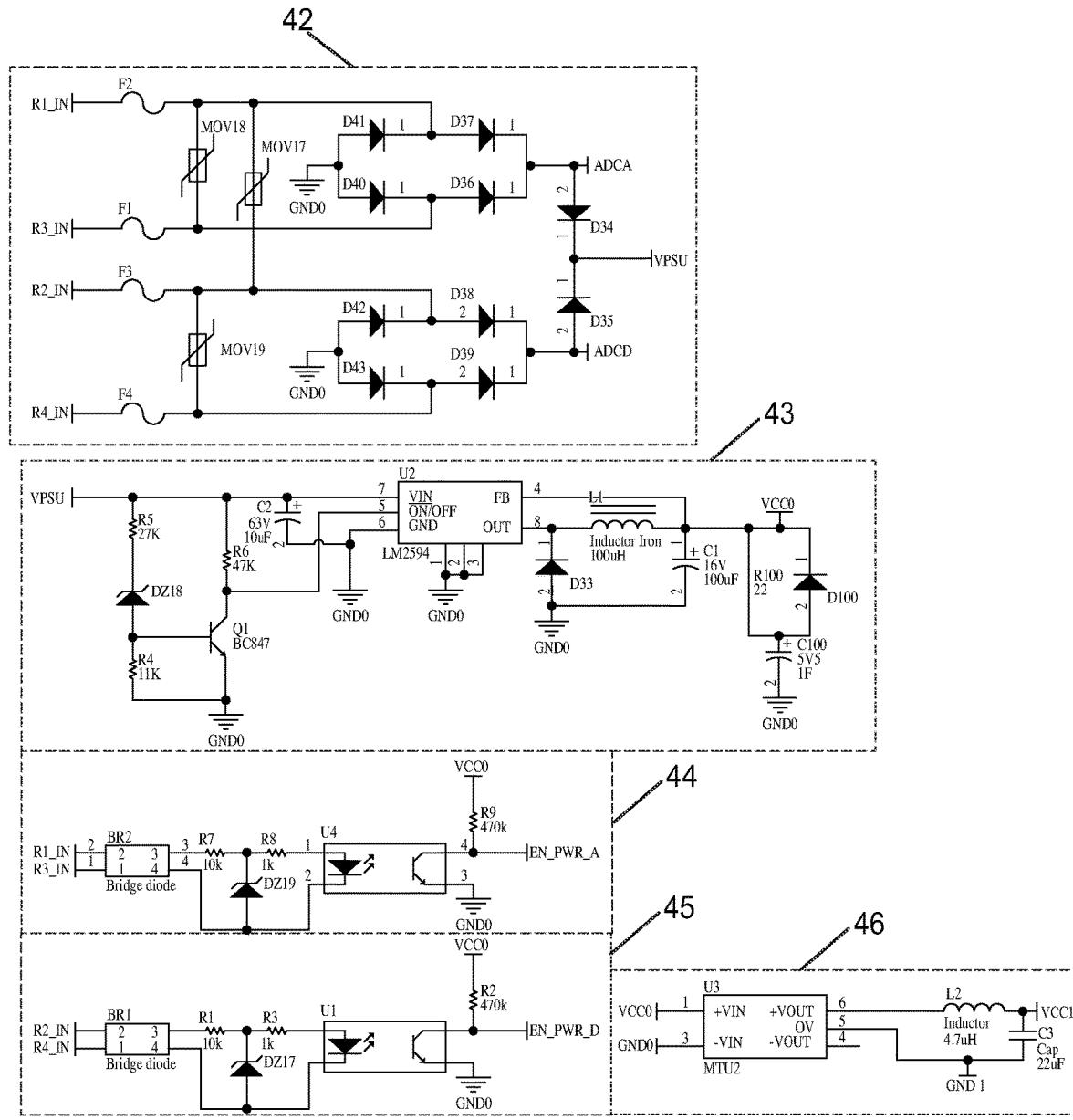
FIG. 4 is a block diagram of the control voltage module.

The control voltage module as shown in FIG. 4 is used to select and condition the various control voltage parameters, to protect the relay against over-current and over-voltage conditions and to provide temporary power to the controller module enabling the relay to continue to function when the applied control voltage decreases below the minimum voltage level required for the microcontroller to function reliably.

In one embodiment, the relay is configured as a single relay and the control voltage, appearing on the plugboard across terminals R1 and R2, is re-routed by the configuration board to appear as signals R1_IN and R2_IN.

In another preferred embodiment, the relay is configured as a dual relay and the control voltage for relay A, appearing on the plugboard across terminals R1 and R3, is similarly re-routed by the configuration board to appear as signals R1_IN and R3_IN and the control voltage for relay D, appearing on the plugboard across terminals R2 and R4 is similarly re-routed by the configuration board to appear as signals R2_IN and R4_IN.

Over-voltage and over-current protection is illustrated at 42, where inputs R1_IN, R2_IN, R3_IN and R4_IN are equipped with fuses F1, F2, F3 and F4 for over-current protection. Fuses are required on both legs of the circuits in order to protect the relay when it is configured as a neutral relay.

Metal oxide varistors ("MOV17"), ("MOV18") and ("MOV19"), mounted across the control voltage inputs, protect the relay against excessive transient voltages. When the control voltage increases to the clamping voltage level of the metal oxide varistors ("MOV"), the MOV begins to conduct, creating a low resistance path and allowing current to flow between the control voltage input connections, while maintaining the control voltage at the level of the clamping voltage. As the magnitude of the over-voltage condition increases, the magnitude of the shunted current also increases. When the value of the shunted current reaches the rated fuse value, the fuse will open, isolating the relay and protecting it from any damage, which may be caused by the over-voltage condition.

It will be appreciated by the person skilled in the art that alternatives to metal oxide varistors, such as transient-voltage-suppression diodes and spark gaps, are available and could be substituted for the MOVs. It will be further appreciated that alternatives to fuses, such as positive temperature coefficient thermistors ("PTCs"), are available and could be substituted for the fuses mentioned herein.

Control voltage polarity selection 42, where an arrangement of diodes D34 through D43, along with MOV17 allows the relay to be configured as either a biased relay or neutral relay, as well as either a single relay or a twin relay, as determined by the placement of these components as summarised in the Table below:

| Device | Twin Neutral | Twin Biased | Single Neutral | Single Biased |
|---|---|---|---|---|
| MOV17 |  |  | ✓ | ✓ |
| D34 | ✓ | ✓ | 0Ω Jumper | 0Ω Jumper |
| D35 | ✓ | ✓ | 0Ω Jumper | 0Ω Jumper |
| D36 | ✓ |  |  |  |
| D37 | ✓ | ✓ | ✓ | ✓ |
| D38 | ✓ | ✓ | ✓ |  |
| D39 | ✓ |  |  |  |
| D40 | ✓ | ✓ |  |  |
| D41 | ✓ |  | ✓ |  |
| D42 | ✓ |  | ✓ | ✓ |
| D43 | ✓ | ✓ |  |  |

The output from this section provides the input to the voltage regulator 43. For example, where it is desired to configure the relay as a twin neutral relay, Diodes D34 through D43 are installed and MOV17 omitted, creating a full wave bridge rectifier circuit, such that a positive voltage will appear on outputs ADC_A, ADC_D and VPSU, regardless of the input voltage polarity.

Conversely, where it is desired to configure the relay as a single biased relay, MOV17 is installed, only Diodes D37 and D42 are installed with Diodes D34 and D35 being replaced with 0Ω jumpers, which effectively eliminates the full wave bridge rectifier circuit, such that a positive voltage will only appear on outputs ADC_A and VPSU, when R1_IN is positive with respect to R2_IN.

Signal ADC_A is fed into the analogue to digital converter contained within microcontroller A on the controller module for processing. Diode D9 provides a voltage to microcontroller A, when a voltage is present on ADC_A. Similarly, signal ADC_D is fed into the analogue to digital converter contained within microcontroller D on the controller module. This arrangement allows for the independent activation of either relay A or relay D, when the relay is configured as a dual relay.

The power supply section is shown generally at 43. Transistor Q1, along with Resistors R4, R5, R6 and Zener Diode DZ18, are used to maintain the voltage regulator U1 in the off-state until the power supply input voltage is sufficient to ensure that a steady, regulated and clearly defined DC voltage level can be generated and maintained by the regulator. Capacitor C1 filters out any AC component appearing on the input voltage. Voltage regulator U1, in conjunction with inductor L1, capacitor C2 and Diode D11, provides a stable, regulated DC voltage for operation of the digital circuitry of the relay.

An energy storage device is presented in the form of a supercapacitor at C100. Resistor R100 and diode D100 control the charging/discharging of the energy storage device.

It is noted that while the voltage regulator circuitry is depicted as a step-down switching voltage regulator, alternative devices, such as linear voltage regulators, are also available to provide the stable, regulated DC voltage required for operation of the digital circuitry of the relay.

The control voltage detection circuits for microcontroller A and microcontroller D are illustrated at 44 and 45, respectively. As both circuits are similar, only the circuit for microcontroller A is discussed herein.

The control voltage derived from the plugboard is rectified by bridge Diode BR2, regulated by Zener Diode DZ19 and used to control optoisolator U4. Resistors R7 and R8 limit the current applied to the input of the optoisolator. The optoisolator provides signal EN_PWR_A to microcontroller A when a voltage greater than the zener voltage of DZ19 is applied to the plugboard, providing an indication to microcontroller A that a control voltage has been detected.

The voltage isolation circuitry is generally illustrated at 46 and includes DC to DC converter MTU2, which derives power signals VCC1 and GND1 from power signals VCC0 and GND0, while maintaining electrical isolation between the two. This arrangement ensures electrical isolation of the two microcontrollers on the controller module.

Figure 5:
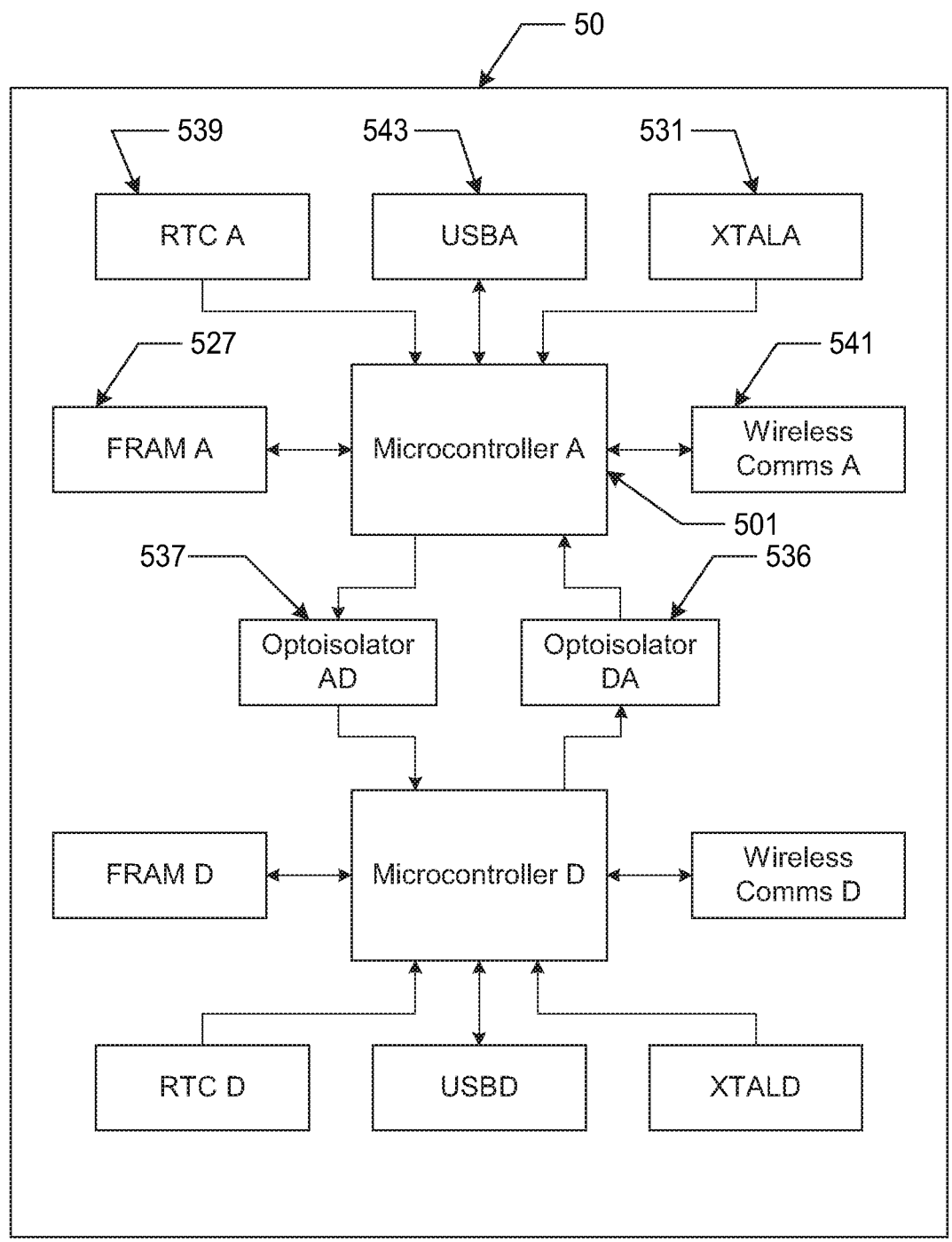
FIG. 5 is a block diagram of the controller module.

The controller module, which provides the means by which the operation of the relay is controlled, is depicted in FIG. 5. As both microcontrollers are similar, only circuitry associated with microcontroller A is described in detail here. Microcontroller A 501 interfaces with a number of dedicated devices comprising controller module 50, including non-volatile ferroelectric random access memory (FRAM A) 527, real time clock circuit (RTC A) 539 and wireless communication circuit (Wireless Comms A) 541, as well as a universal serial bus interface (USBA) 543 for hardwired communication with systems external to relay 10. Microcontroller D is similar. All communications between microcontroller A 501 and microcontroller D 502 is achieved via optoisolators, Optoisolator AD 537 and Optoisolator DA 536.

Figure 5A:
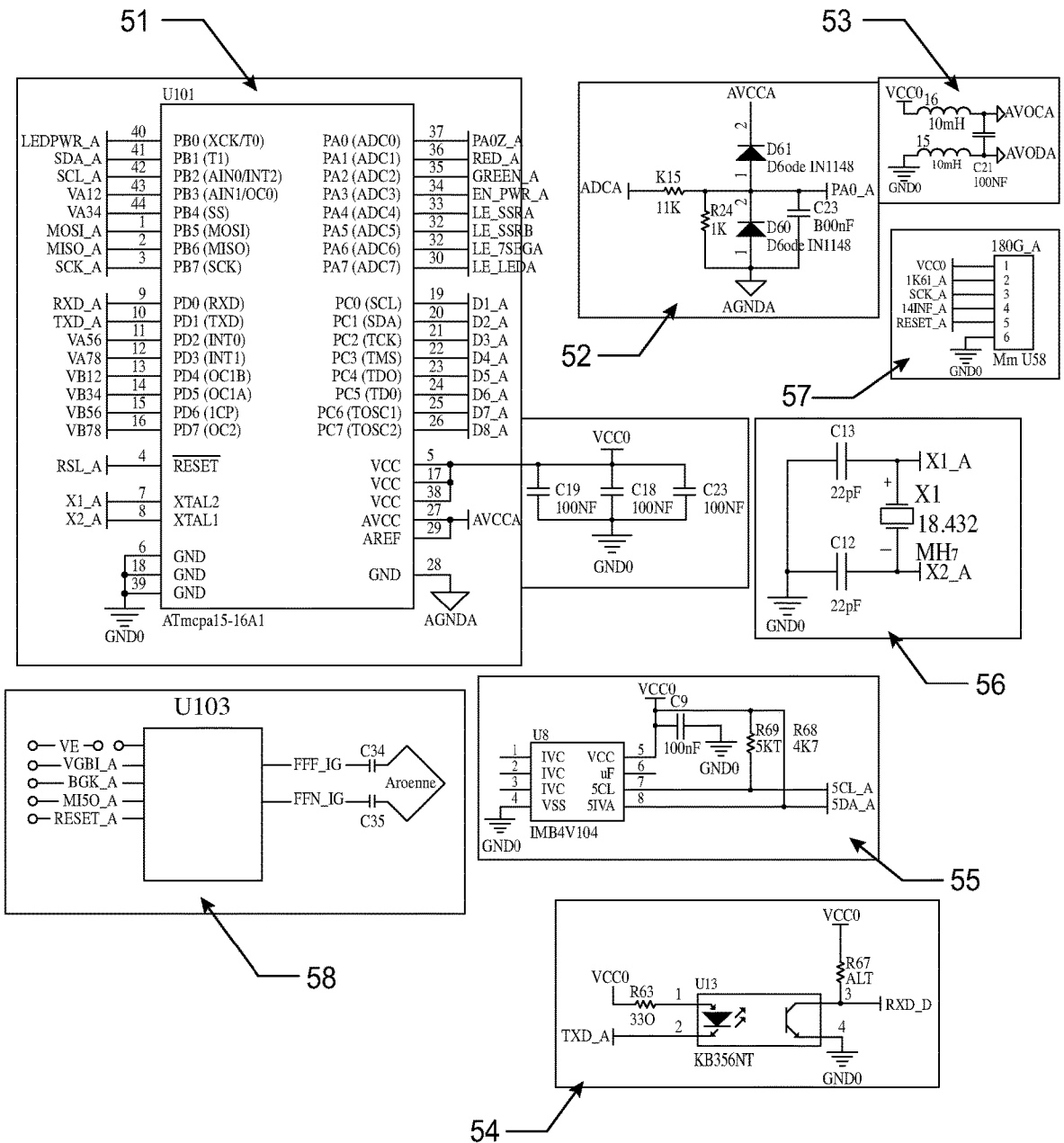
FIG. 5A illustrates interfaces between the controller module and other modules of the relay.

FIG. 5A depicts the internal interfaces of controller module 50 in more detail. Microcontrollers 501 and 502 interface with the various other modules in relay 10 through four I/O Ports. Microcontroller A, 501 interfaces to these modules via Port AA 503, Port AB 505, Port AC 507 and Port AD 509. Similarly, Microcontroller D interfaces to these modules via Port DA 504, Port DB 506, Port DC 508 and Port DD 510.

Figure 5B:
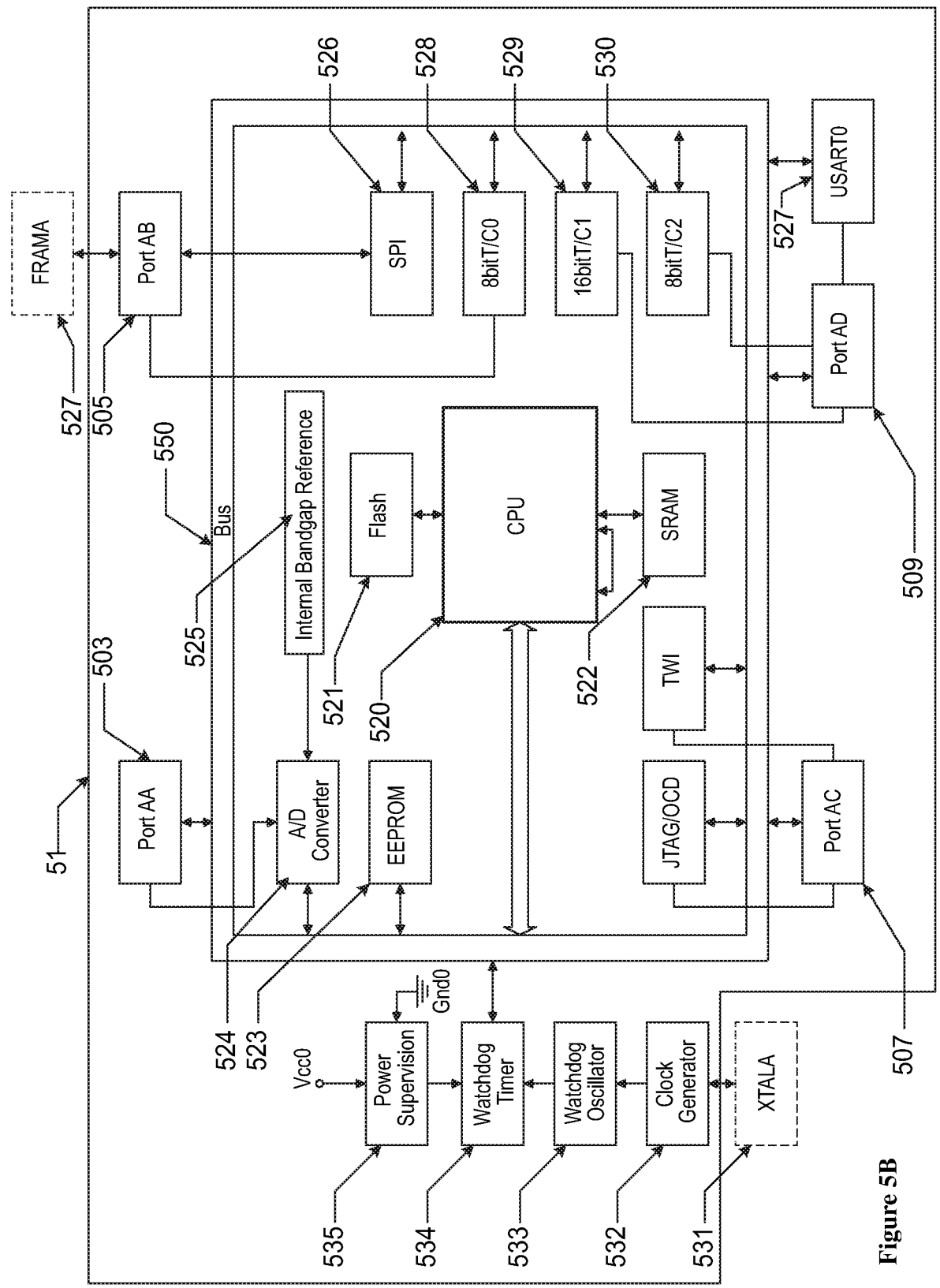
FIG. 5B is a block diagram of the internal structure of one the microcontrollers in the controller module.

FIG. 5B illustrates the internal structure of microcontroller A 501. Microcontroller D is similar.

While the circuitry illustrated is based upon the 8-bit Atmel ATMEGA324 microcontroller, there is a wide range of other microcontrollers, which could be substituted without significantly affecting the capabilities of the relay.

Microcontroller A 501 comprises a central processing unit (CPU) 520, programmable non-volatile memory (Flash) 521, static random access memory (SRAM) 522 and electrically-erasable programmable read-only memory (EEPROM) 523.

Analog to digital conversion circuitry (A/D Converter) 524 is provided to digitise analog signals received via Port AA 503. Calibration of the A/D Converter 524 is performed through the use of the internal bandgap reference 525.

A serial peripheral interface Master/Slave (SPI) 526 is provided for communication with devices external to the relay 10 via Port AB 505.

Port AB also provides a serial interface for the FRAM A 527 also located on controller module 50, which is utilised to overcome lifecycle issues associated with the EEPROM 523 internal to the microcontrollers.

Data destined for the switch modules and display module are output on Port AC 507 with individual module selection performed by decoding the signals output from Port AA 503, which latches the signals from Port AC 507 on the target module.

Inputs from the switch modules are received on Port AB 505 and Port AD 509. Port AB 505 also provides the connection to the USBA port 543 for an SPI connection to an external system for downloading/uploading the EEPROM image and/or other data.

Diverse means are utilised for communications with Flash 521 and SRAM 522 directly interfacing with CPU 520 for improved speed; EEPROM 523 interfaces with CPU 520 via internal Bus 550 and FRAM A 527 via Port AB 505.

A programmable universal synchronous/asynchronous receiver/transmitter (USART) circuit, USARTO 532 is provided for communication with devices internal to the relay 10 via Port AA 503.

In addition to a 16-bit timer counter (TC1) 529, two 8-bit timer counters (TC0) 528 and (TC2) 530 are also provided.

An external crystal (XTALA) 531, also comprising controller module 50, provides input to the clock generator circuit 532. A watchdog oscillator 533 develops the timing parameters for the watchdog timer 534 from the clock generator circuit 532.

Power supervision circuit 535 continuously monitors VCC0 and Gnd0, causing watchdog timer 534 to invoke a timeout, if the voltage drops below a specified value.

Port A (bits PA1, PA2) controls which colour LED is displayed for each switch in the switch status LED on the display module.

When the relay is powered up for the first time during manufacture, the microcontroller EEPROM contents are copied to the FRAM to improve memory storage properties. The microcontroller uses software flags to determine if this is the first time it has powered up. If the power-up flag has not been set, then a comprehensive set of integrity tests are performed to confirm correct functionality. If an error is detected, the relay sets an error flag, commands all switches to their default state, records the error type in EEPROM and FRAM, displaying it on the display module, and enters an endless loop from which there is no recovery. This error flag is read during all subsequent start-up sequences and if set, the relay enters the endless loop.

It is desirable that the start-up time be as short as possible in order for the relay to respond quickly to inputs from the overall signaling system. To accomplish this, all subsequent start-up sequences will execute a subset of the integrity tests if no errors have been detected.

The clock circuitry 56 is crystal-based and provides a highly stable clock source for microcontroller A. When a recordable event, such as a switch failure, is detected either by microcontroller A or microcontroller D, bit 2 in the two-wire serial interface register (not shown) of the microcontroller ("TWCR") in microcontroller A is set to disconnect PC0 and PC1 from Port C. PC0 becomes the serial clock ("SCL") for the real time clock circuitry 59 and PC1 becomes the serial data ("SDA") for the real time clock circuitry 59. Data from the real time clock circuitry 59 are then serially input as signal SDA, where they are appended to the event data and stored in both FRAM and EEPROM memories.

The circuitry shown at 57 carries signals MOSI_A, SCK_A and MISO_A to a host computer for downloading/uploading operating system software or other data, as required.

The external communication section of the controller module is shown at 58 and comprises a transceiver U103, filter capacitors C34 and C35 and an antenna. Jumper JP7 allows the communication section of the controller module to be disabled when downloading/uploading operating system software.

The communications system is based upon the Open Platform Communications ("OPC") series of standards and specifications for industrial telecommunication and enables real-time relay data to be transmitted via a webserver to various client applications, such as workstations and mobile computing devices, which can then query individual relays or groups of relays, as well as receive and acknowledge relay alarms. It is envisaged that relay data can be stored in a secure cloud-hosted Structured Query Language ("SQL") database accessible by users at any time from any location. The SQL structure of the data also provides the ability for the operator's maintenance system to directly access information to aid in the generation of work orders, service requests, field inspections and the like.

It is further envisaged that the present solid-state time-delay relay will forward operational data to a central system and will become part of a mesh network.

Figure 6:
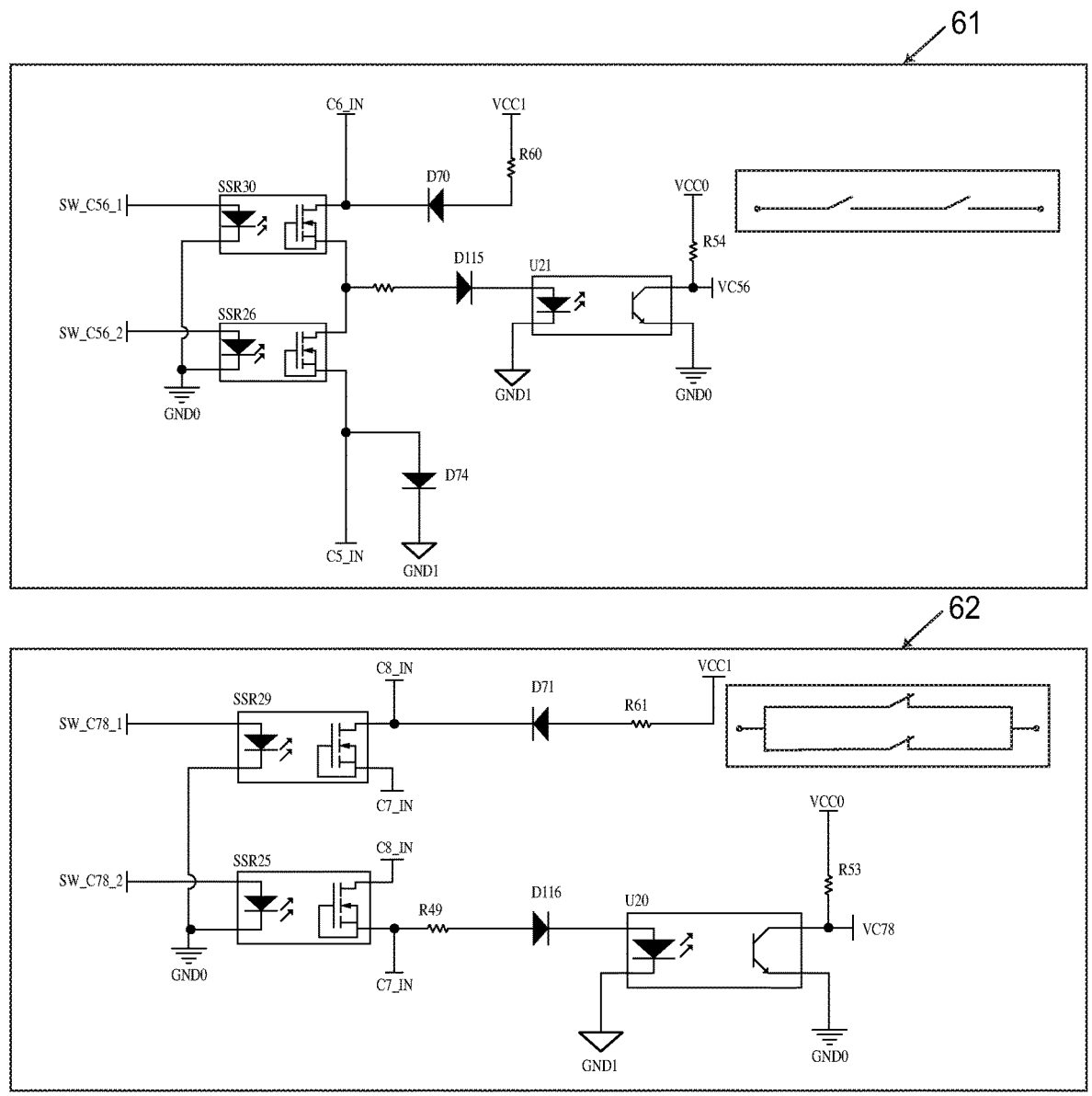
FIG. 6 is a block diagram of a representative portion of the switch module of the relay.

FIG. 6 depicts the switch module 60 and illustrates several typical switch arrangements, which comprise a single typical normally open switch 61 and a single typical normally closed switch 62.

In one form, the switch module 60 also incorporates a current sensing feature (not shown) utilizing a current sense amplifier (not shown) to measure the load current flowing through the switch.

Switches are arranged in stacks or columns A through D with switch contact pairs in rows 1 through 4. The relay is comprised of up to four switch modules, identified as SSRA through SSRD, with each module corresponding to a switch stack. The switches themselves are referred to according to their column and row, such that switch A12 refers to the switch on the SSRA switch module which, unless rerouted by the configuration module, is used to connect plugboard connection A1 to plugboard connection A2.

With regard to the normally open switch 61, an input signal applied at C6_IN is selectably switched by optically coupled mosfets, SSR30 and SSR26, to output C5_IN only when signal SW_C56_1 is asserted by microcontroller A and signal SW_C56_2 is asserted by microcontroller D.

It is to be noted and as will be apparent to the person skilled in the art, in accordance with generally accepted railway signalling principles, even-numbered plugboard connections to normally closed switches are positive with respect to the odd-numbered terminals and odd-numbered plugboard connections to normally open switches are positive with respect to the even-numbered terminals.

Diode D70 blocks any back electromotive force ("emf") generated when the relay is used as a low side switch for an inductive load, such as an electromechanical relay. Similarly, Diode D74 is used to block any back emf generated, when the relay is used as a high side switch for an inductive load.

Resistor R54 provides a known state for signal C6_IN in the absence of any externally applied voltage to C6_IN. Software controllable pull-up resistors (not shown) internal to the controller module are used to provide a known default state for signal VC_56, while SSR30 is in the open state.

The presence of a voltage input by the user, which is subsequently controlled by the relay, at the junction between SSR30 and SSR26 is detectable by the use of optoisolator U21 in conjunction with resistor R50 and Diode D115 to generate signal VC_56. This signal is then fed to the controller module for analysis.

During operation, any software designed to accompany the present relay will ensure that the state of each mosfet switch is checked periodically and continuously and is compared with its expected state.

With regard now to the normally closed switch 62, it can be seen to operate in an analogous manner. An input signal applied at C8_IN is selectably switched by optically coupled mosfets SSR29 and SSR25 to output C7_IN only when signal SW_C78_1 is asserted by microcontroller A and signal SW_C78_2 is asserted by microcontroller D.

Diodes D71 and D116 as well as the software controllable internal pull-up resistor function in a manner analogous to Diodes D70 and D74 in the normally open switch circuit.

The presence of a voltage input by the user, which is subsequently controlled by the relay, at plugboard connection C7_IN is detectable by the use of optoisolator U20 in conjunction with resistor R49 and diode D116 to generate signal VC_78, which is then fed to the controller module for analysis.

In one form, the switch module also incorporates a current sensing feature (not shown) utilizing a current sense amplifier (not shown) to measure the load current flowing through the switch. The current sense amplifier (not shown) converts this load current to a small voltage, which is then amplified and forwarded to the controller module shown in FIG. 5 for processing.

Figure 7:
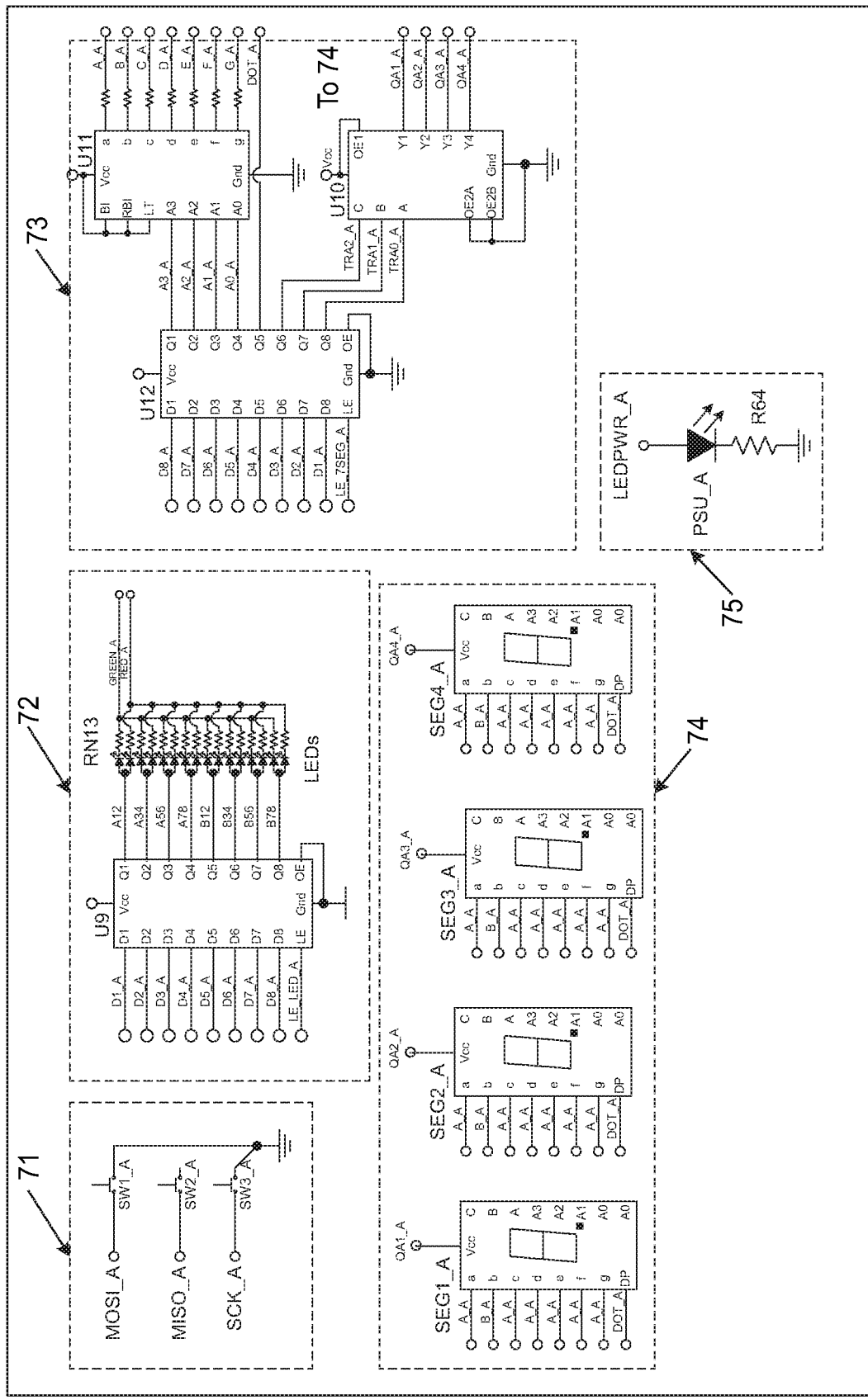
FIG. 7 is a schematic of the display module.

FIG. 7 depicts the portion of the display module 70 corresponding to microcontroller A, comprising the programming pushbuttons, a switch status LED array, a multiplexing decoding circuit, a 4 digit 7 segment display and a power supply status indicator.

The portion of the display module for entering specified relay parameters for microcontroller A is shown generally at 71, comprising momentary pushbutton switches SW1_A, SW2_A and SW_3A, which set microcontroller A signals MOSI_A, MISO_A and SCK_A to a known state when pressed.

The portion of the display module for detecting the state of the pushbuttons read by microcontroller D is similar.

The switch status LED array is arranged in the form of stacks A through D, corresponding to plugboard connection stacks A through D.

The portion 72 of the switch status LED array driven by microcontroller A corresponds to the A stack of plugboard connections. Octal D-type flip-flop latch U9 stores data from microcontroller A, appearing on data bus lines D1_A through D8_A, when microcontroller A asserts signal LE_LED_A. Outputs from U9 control the illumination of LEDs A12, A34, A56, A78, B12, B34, B56 and B78, according to the latched state of the inputs D1_A through D8_A.

The portion of the switch status LED array, corresponding to the switch status LED array stacks B, C and D (not shown), is similar to data controlling the illumination of stacks A and B generated by microcontroller A and data controlling the illumination of stacks C and D generated by microcontroller D.

The portion of the display module for controlling the 7-segment displays driven by microcontroller A is shown at 73 and provides a means for multiplexing and decoding the signals generated by microcontroller A and is comprised of an octal D-type flip-flop U12, a 3-line to 8-line decoder U10 and a BCD to 7-segment decoder U11.

Decoder U12 stores the data from microcontroller A appearing on data bus lines D1_A through D8_A when microcontroller A asserts signal LE_7SEG_A. Decoder U12 outputs signals A0_A, A1_A, A2_A and A3_A to Decoder U11 which, in turn, generates signals A_A through to G_A for the illumination of the individual segments a through each 7-segment display SEG1_A, SEG2_A, SEG3_A and SEG4_A, shown at 74. Decoder U12 also outputs signal DOT_A for the illumination of the decimal point indicator of each of the 7-segment displays.

Decoder U12 also generates signals TRA0_A, TRA1_A and TRA2_A, which are input to Decoder U10 to generate signals QA1_A, QA2_A, QA3_A and QA4_A, which individually select 7-segment displays SEG1_A, SEG2_A, SEG3_A and SEG4_A, respectively, shown at 74.

The portion of the display module for controlling the 7-segment displays driven by microcontroller D is similar.

The portion 75 of the display module for controlling the power supply status indication corresponding to microcontroller A, comprises an indicator LED PSU_A and a current limiting resistor R64. Signal LEDPWR_A, generated by microcontroller A, determines the illumination of LED PSU_A.

The portion of the power supply status indication, corresponding to microcontroller D, is similar.

Figure 8:
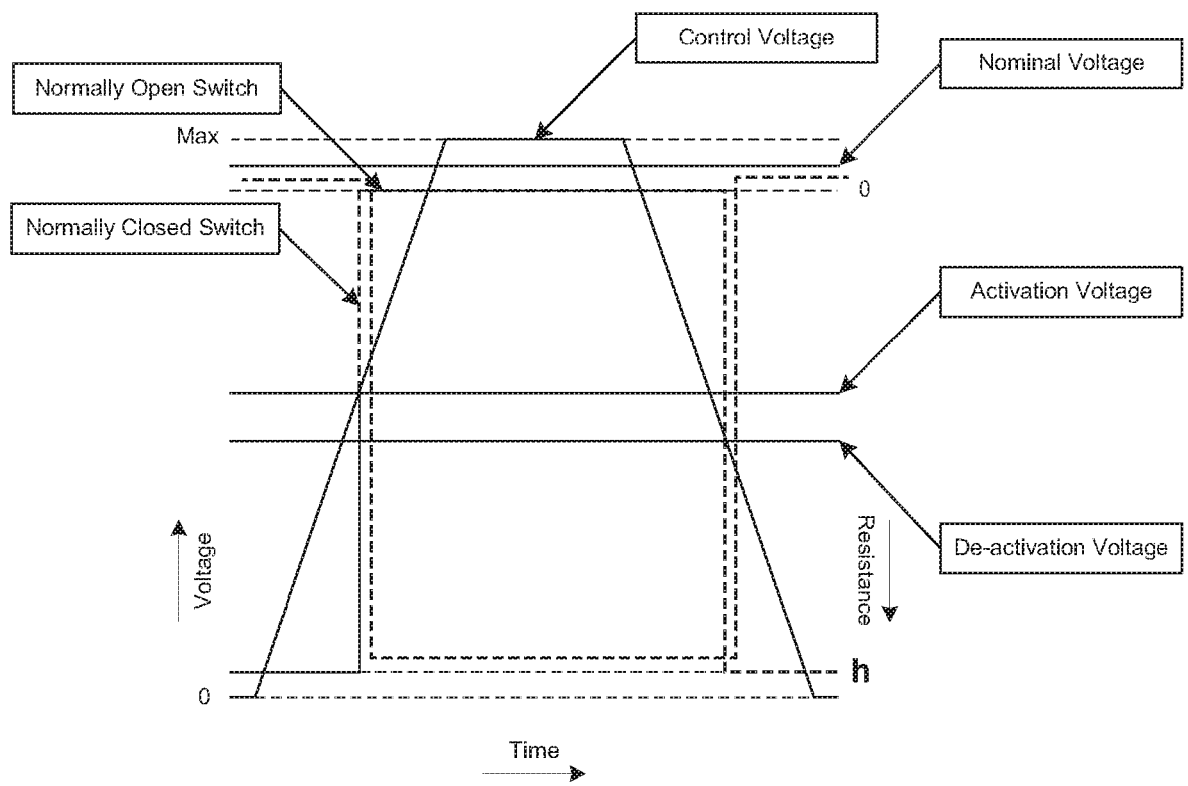
FIG. 8 is a diagram illustrating the relationships between the switches and the various levels of control voltages applied to the relay.

FIG. 8 depicts the various control voltage parameters and the response of normally open and normally closed switches in response to the control voltage levels. The skilled person will note that the plot for the normally closed switch has been intentionally displaced in both axes to aid readability and will also note that the values for all delay timer values are 0 for this figure.

When the level of the control voltage increases to the activation voltage level, the normally closed switches open and the normally open switches close. The switches remain in these states until the level of the control voltage decreases to the de-activation voltage level.

Figure 9:
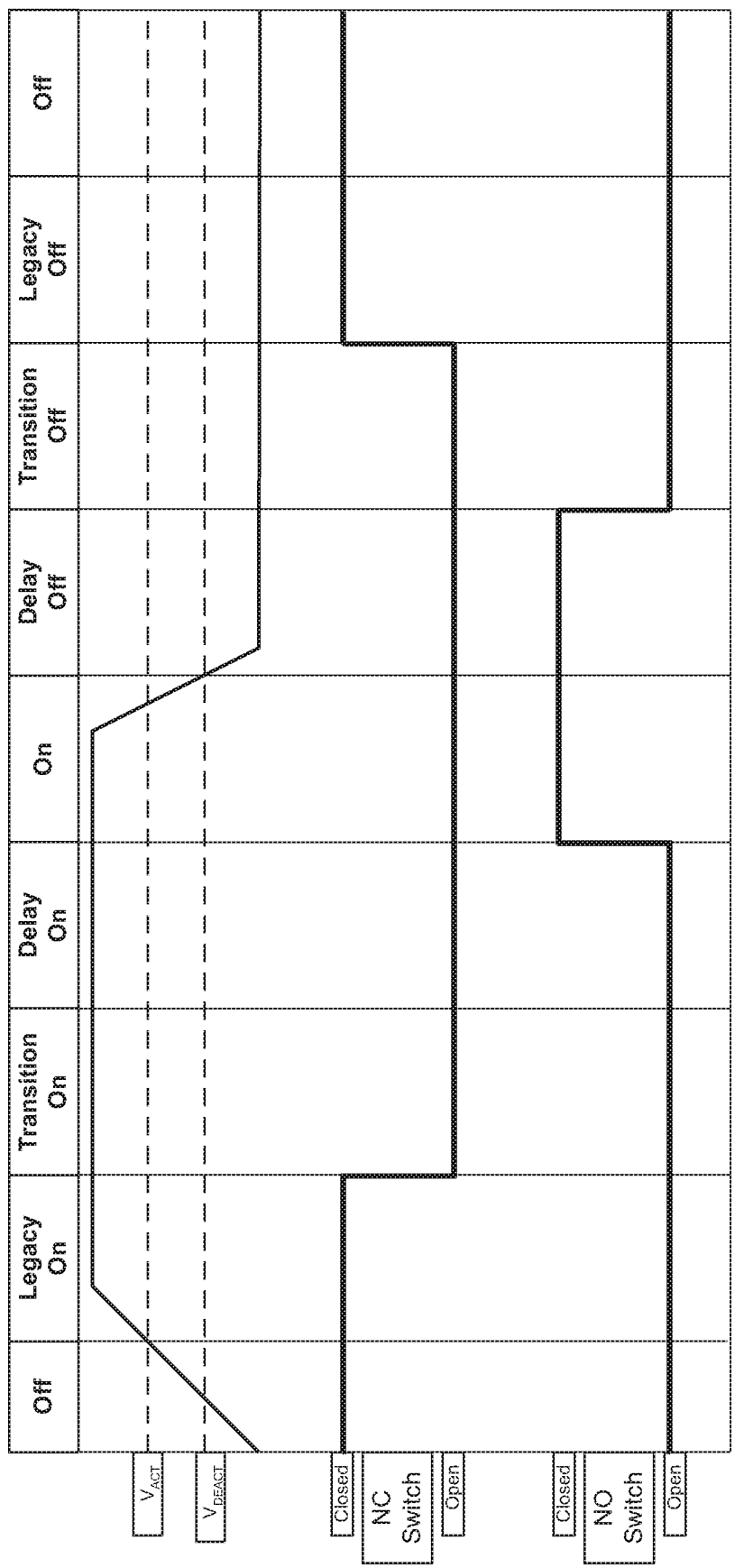
FIG. 9 is a timing diagram illustrating some of the various time delays available.

FIG. 9 depicts some of the various timing delay parameters available in the solid-state relay.

The Legacy On delay begins when the control voltage level reaches the activation voltage level and is preferably set to accommodate any target external signalling equipment with a slow response time. This delay will prevent the switched signals reaching the target equipment before they are expected. The Legacy On delay is also preferably used simply to delay the opening of the normally closed switches, where it is desired to maintain the signals switched by the normally closed switches for a pre-determined period of time.

The Transition On delay begins with the opening of the normally closed switches and ensures that no normally open switch is closed, while any normally closed switch is also closed. Where no normally closed switches are provided, the Transition on delay can be set to 0.

The Delay On delay provides a slow pick capability for the normally open switches to delay the signals switched by the normally open switches for a pre-determined period of time.

The On time is usually determined solely by the control voltage level and the programmed On time is effectively infinite. The On time usually terminates when the control voltage level decreases to the de-activation voltage level. The On time can, however, be programmed to be a shorter time period in order to set the maximum time that normally open switches can be closed. The On time can be used in circuits where a certain condition must be achieved within a specified time period. The solid-state relay of the present invention provides a time-out capability for such applications.

The Delay Off delay provides a slow drop capability for the normally open switches to maintain the signals switched by the normally open switches for a pre-determined period of time.

The Transition Off delay begins with the opening of the normally closed switches and ensures that no normally open switch is closed, while any normally closed switch is also closed. Where no normally closed switches are provided, the Transition off delay can be set to 0.

The Legacy Off delay is preferably set to accommodate any target external signalling equipment with a slow response time. This delay will prevent the switched signals to the target equipment from being extinguished before they are expected. The Legacy Off delay is preferably also used simply to delay the closing of the normally closed switches, where it is desired to inhibit the signals switched by the normally closed switches for a pre-determined period of time.

As with other forms of the present invention, the configuration module is used to re-route specified plugboard signals to specified pins on the electronic industry connectors.

In order to provide 'near' plug-in compatibility with a particular form of existing electromechanical relays, the slave control input is applied across plugboard connections D3 and D4, the slave verification inputs are applied across plugboard connections D5 and D6 and the slave relay is connected to plugboard connections R3 and R4. Further, to provide 'near' plug-in compatibility, plugboard connection A1 (not shown) is driven to a logic high state by the controller module and the states of plugboard connections A2, A3 and A7 (not shown) are detected by the controller module to indicate the presence of any plugboard strappings installed across A1, A2, A3 and A7 (not shown). It should be noted that the nominal voltage of the slave relay must be the same as the nominal voltage of this slow release solid-state relay.

Alternatively, in one form, a normally open contact is connected to a voltage source of the same nominal voltage as the slave relay to provide the activation voltage to both the programmable relay and the slave relay. The current state of the at least one switches is maintained until a corresponding timer has expired, at which time, the state of the remaining at least one switches is set to corresponding, individually pre-determined subsequent states. As with relay operation upon activation, there are a plurality of pre-determined time values and a plurality of corresponding subsequent states for the remaining at least one switches during de-activation.

In use, the programmable relay is controlled by software running on the controller module to control the de-activation delay of the relay. When the relay is configured as a slow release relay, the release of an energised slave relay is delayed after the opening of a control contact and one or more of the switch modules are pre-determined to function as slave relay control switches and one or more of the switch modules are pre-determined to control the activation of one or more slave relays. Additionally, one or more of the switch modules are pre-determined to function as slave relay verification switches to confirm the state of the corresponding slave relay. When the relay is configured as a slow release relay, latching must be enabled, as described above.

When the control voltage applied to the relay decreases to the de-activation voltage level, the state of all switches is maintained in their last state by virtue of the latching function. When the slave control input becomes an open circuit, the timer is loaded with a first time value and the timer started, as described above. As with the activation timing, multiple sequential timer values are preferably incorporated. When the last timer has expired, the relay is unlatched and the slave relay becomes de-energised.

Figure 10:
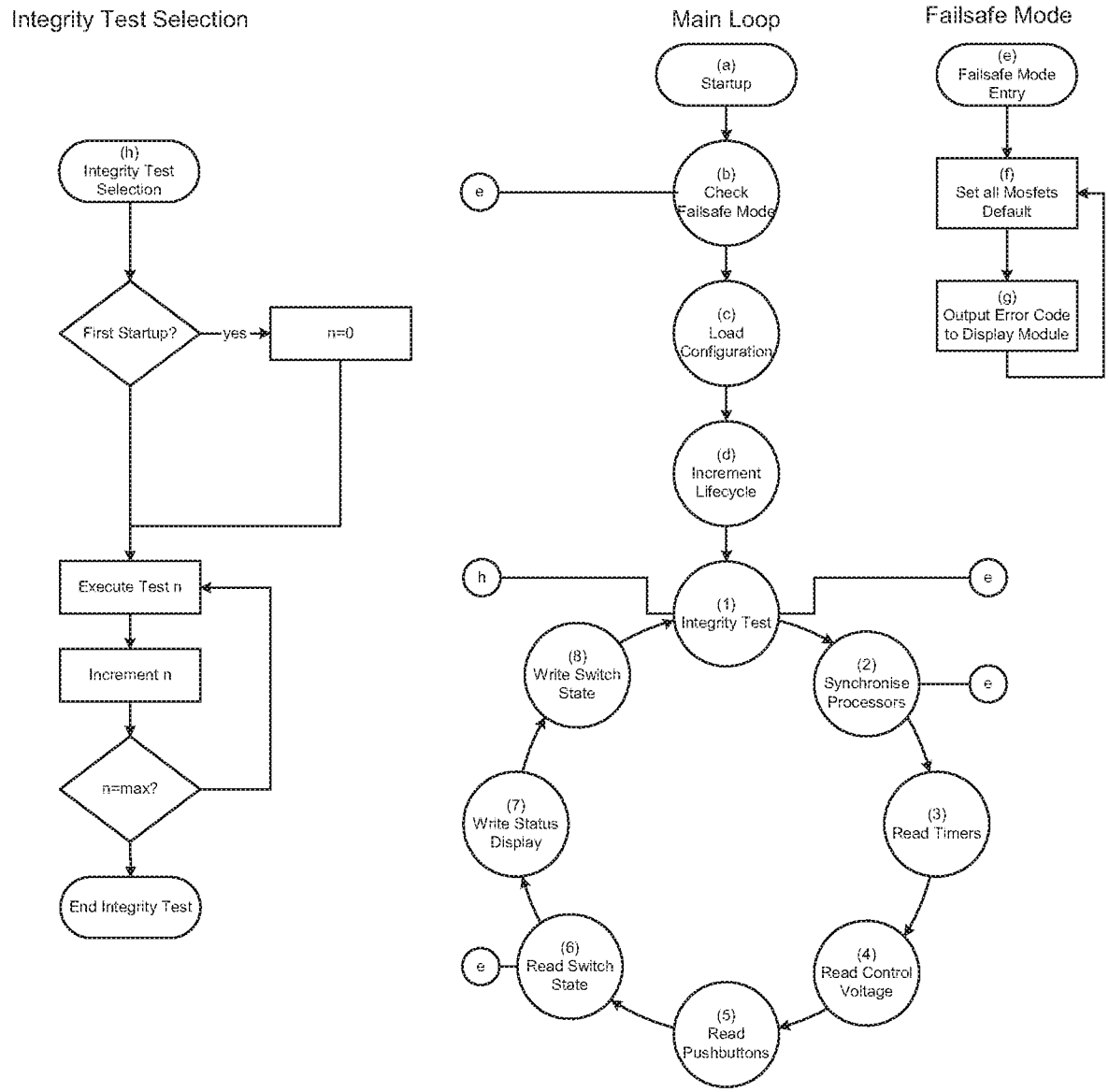
FIG. 10 is a diagram of a typical application of the relay as a slow release relay.

FIG. 10 also presents the integrity test section (h) in more detail. As stated earlier, it is desirable that the start-up time be as short as possible. To accomplish this, a full set of comprehensive integrity tests are performed upon the first start-up during manufacture and all subsequent start-up sequences execute a subset of the integrity tests.

If it is detected that it is not the first start-up, a first subset of integrity tests is performed during the first passage through the main loop. Each subsequent passage through the main loop triggers a subsequent subset of integrity tests to be performed. Once all integrity subsets have been successfully executed, the sequence begins again with the first subset of integrity tests. In this manner, the integrity of the relay is confirmed after several passages through the main loop, while minimizing start-up time.

If an error is detected at any time during the integrity test process, the relay enters failsafe mode (e).

Turning to the switch checking process that can be used, the switch type is first determined by examination of the loaded configuration data for the relay. The individual mosfets in each pair comprising each switch are then activated and deactivated in the sequence as shown in FIG. 10A, which is a flow chart illustrating the checking process and which should be read in conjunction with FIG. 6.

Between each step, the presence or absence of a voltage (shown generically in the flowchart as Vz) is determined by the controller module. Signal Vz is derived from the Optoisolators shown as U21 and U20 in FIG. 6. The relay generates a separate Vz for each mosfet pair and transmits this information to the control module.

Figure 10A:
FIG. 10A presents a flow chart illustrating the switch checking that can be used.

The flow chart of FIG. 10A shows typical normally open switch C56, comprised of mosfets SSR30 and SSR26, and typical normally closed switch C78, comprised of mosfets SSR29 and SSR25.

Pull-up resistors internal to the controllers are used to set the switch status input signals VC56 to a known state in the absence of a voltage at the junction of the mosfets SSR30 and SSR26 comprising the normally open switch.

Pull-up resistors internal to the controllers are similarly used in the normally closed switch to set the switch status input signal VC78 to a known state in the absence of a voltage at the output of mosfet SSR25.

If the switch to be checked is a normally open switch, then microcontroller A, using signal SW_C56_1, commands mosfet SSR30 to be open and microcontroller D, using signal SW_C56_2, commands mosfet SSR26 to be open.

If a voltage is detected at the junction of the two mosfets SSR30 and SSR26 (signal VC56), then mosfet SSR30 is considered to have failed the open state test, creating the potential for a wrong-side failure should SSR26 ever also fail in the closed state. The relay enters error 1 mode.

If no voltage is detected at the junction of the two mosfets SSR30 and SSR26, then SSR30 is considered to have passed the open state test and the program continues.

Microcontroller A then, using signal SW_C56_1, commands mosfet SSR30 to be closed while microcontroller D, using signal SW_C56_2, commands mosfet SSR26 to be open.

If no voltage is detected at the junction of the two mosfets SSR30 and SSR26 (signal VC56), then mosfet SSR30 is considered to have failed the closed state test, creating a right-side failure. The relay enters error 3 mode.

If a voltage is detected at the junction of the two mosfets SSR30 and SSR26 (signal VC56), then SSR30 is considered to have passed the closed state test.

Microcontroller A then, using signal SW_C56_1, commands mosfet SSR30 to be open and microcontroller D, using signal SW_C56_2, commands mosfet SSR26 to be open and both microcontrollers turn on the internal pull-ups on the switch status input data lines.

If a voltage is detected at the junction of the two mosfets SSR30 and SSR26 (signal VC56), then SSR26 is considered to have failed the open state test, creating the potential for a wrong-side failure should mosfet SSR30 ever also fail in the closed state. The relay enters error 1 mode.

If no voltage is detected at the junction of the two mosfets SSR30 and SSR26 (signal VC56), then mosfet SSR26 is considered to have passed the open state test.

Microcontroller A then, using signal SW_C56_1, commands mosfet SSR30 to be open and microcontroller D, using signal SW_C56_2, commands mosfet SSR26 to be closed.

If a voltage is detected at the junction of the two mosfets SSR30 is considered to have failed the open state test. The relay enters error 1 mode.

If no voltage is detected at the junction of the two mosfets SSR30 and SSR26 (signal VC56), then mosfet SSR30 is considered to have passed the open state test.

Control then returns to the calling program.

If the switch to be checked is a normally closed switch, then microcontroller A, using signal SW_C78_1, and microcontroller D, using signal SW_C78_2, command mosfets SSR29 and SSR25, respectively, to be closed. As with the normally open switch, the microcontrollers turn on the internal pull-ups on the switch status input data lines and set the switch status to known state.

If no voltage is detected at the output of the switch circuit (signal VC78), then both mosfet SSR29 and SSR25 are considered to have failed the closed state test. The relay enters error 1 mode.

Microcontroller A then, using signal SW_C78_1, commands mosfet SSR29 to be closed and microcontroller D, using signal SW_C78_2, commands mosfet SSR25 to be open.

If no voltage is detected at the output of the switch circuit (signal VC78), then mosfet SSR29 is considered to have failed the closed state test. The relay enters error 3 mode.

If a voltage is detected at the output of the switch circuit (signal VC78), then mosfet SSR29 is considered to have passed the closed state test.

Microcontroller A then, using signal SW_C78_1, commands mosfet SSR29 to be open and microcontroller D, using signal SW_C78_2, commands mosfet SSR25 to be closed.

If no voltage is detected at the output of the switch circuit (signal VC78), then mosfet SSR25 is considered to have failed the closed state test. The relay enters error 3 mode.

If a voltage is detected at the output of the switch circuit (signal VC78), then mosfet SSR25 is considered to have passed the closed state test.

Microcontroller A then, using signal SW_C78_1, commands mosfet SSR29 to be open and microcontroller D, using signal SW_C78_2, commands mosfet SSR25 to be open.

If a voltage is detected at the output of the switch circuit (signal VC78), then either mosfet SSR29 or mosfet SSR25 are considered to have failed the open state test. The relay enters error 3 mode.

If no voltage is detected at the output of the switch circuit (signal VC78), then both mosfet SSR29 and SSR25 are considered to have passed the open state test.

Further advantages and improvements may very well be made to the present invention without deviating from its scope. Although the invention has been shown and described in what is considered to be the most practical and preferred embodiment, it is recognized that departures may be made therefrom within the scope and spirit of the invention, which is not to be limited to the details disclosed herein, but is to be accorded the full scope of the claims so as to embrace any and all equivalent devices and apparatus. Any discussion of the prior art throughout the specification should in no way be considered as an admission that such prior art is widely known or forms part of the common general knowledge in this field.

In the summary of the invention, except where the context requires otherwise due to express language or necessary implication, the word "comprising" is used in the sense of "including", i.e. the features specified may be associated with further features in various embodiments of the invention.

The invention claimed is:

1. A fail-safe programmable solid-state relay comprising:
a base module;
a configuration module;
a control voltage module comprising at least one energy storage device;
a controller module having at least two electrically isolated microcontrollers operating in parallel, each microcontroller comprising an internal EEPROM memory and at least one digital timer; and
at least one switch module comprising at least one switching circuit,
wherein the at least one switching circuit has two switches;
wherein the control voltage module is adapted to receive an applied control voltage or current and to permit pre-selection of an activation voltage or current level and a de-activation voltage or current level;
wherein the at least one switching circuit is placed in a state which is selected from at least one normally open switch, or at least one normally closed switch, or a combination thereof;
wherein determination of a state of the control voltage or current operates independently of a voltage or current of the at least one switching circuit; and
wherein the state of the at least one switching circuit is selected from one of:
up to sixteen sets of two normally open switches in series;
up to sixteen sets of two normally closed switches connected in parallel; and
up to sixteen sets of a combination of two normally open switches in series and two normally closed switches in parallel.

2. The fail-safe programmable solid-state relay according to claim 1, wherein,
when the applied control voltage or current exceeds the pre-selected activation voltage or current level,
a response to a polarity of the applied control voltage or current is generated and the at least one switching circuit is set to at least one individually pre-determined first state and the at least one digital timer is loaded with a pre-determined value,
whereafter the at least one digital timer is started to initiate at least one time delay, an expiry of which sets the at least one switching circuit to at least one individually pre-determined subsequent state; and
wherein, when the applied control voltage or current decreases to the pre-selected de-activation voltage or current level, a response is generated whereby the at least one digital timer is started to initiate at least one time delay, an expiry of which sets the at least one switching circuit to at least one individually pre-determined subsequent state.

3. The fail-safe programmable solid-state relay according to claim 1, wherein when a first applied control voltage or current exceeds the pre-selected activation voltage or current level, a response to a polarity of the applied control voltage or current is generated and the at least one switching circuit is set to at least one individually pre-determined first state and the at least one digital timer is loaded with a pre-determined value,
whereafter the at least one digital timer is started to initiate at least one time delay, an expiry of which sets the at least one switching circuit to at least one individually pre-determined subsequent state; and
wherein when a second control voltage or current is applied, the at least one digital timer is loaded with at least one pre-determined time value, an expiry of which sets the at least one switching circuit to at least one individually pre-determined subsequent state.

4. A fail-safe programmable solid-state relay comprising:
a base module;
a configuration module;
a control voltage module comprising at least one energy storage device; a controller module having at least two electrically isolated microcontrollers operating in parallel, each microcontroller comprising an internal EEPROM memory and at least one digital timer; and at least one switch module comprising at least one switching circuit,
wherein the at least one switching circuit has two switches;
wherein the control voltage module is adapted to receive an applied control voltage or current and to permit pre-selection of an activation voltage or current level and a de-activation voltage or current level;
wherein the at least one switching circuit is placed in a state which is selected from at least one normally open switch, or at least one normally closed switch, or a combination thereof;
wherein determination of a state of the control voltage or current operates independently of a voltage or current of the at least one switching circuit; and
wherein the energy storage device provides sufficient power to a portion of the at least two microcontrollers,
whereby when the applied control voltage or current decreases to a minimum voltage or current level,
an ability of the at least two microcontrollers to control the state of the at least one normally open switch, the at least one normally closed switch, or a combination thereof is substantially maintained.

5. A fail-safe programmable solid-state relay comprising:
a base module;
a configuration module;
a control voltage module comprising at least one energy storage device;
a controller module having at least two electrically isolated microcontrollers operating in parallel, each microcontroller comprising an internal EEPROM memory and at least one digital timer; and at least one switch module comprising at least one switching circuit, wherein the at least one switching circuit has two switches;

wherein the control voltage module is adapted to receive an applied control voltage or current and to permit pre-selection of an activation voltage or current level and a de-activation voltage or current level; and wherein the controller module further comprises at least one Ferroelectric Random Access Memory (FRAM) device associated with each microcontroller, wherein upon initialization of a software program used to control the relay, contents of the at least one internal EEPROM memory are copied to the FRAM device and substituted therefor during one or more subsequent operations of the software program.

6. The fail-safe programmable solid-state relay according claim 1, further comprising a display module.

7. The fail-safe programmable solid-state relay according to claim 6, wherein the display module comprises at least one visual indicator selected from at least one light emitting diode, at least one multi-segmented display, at least one liquid crystal display, or combinations thereof.

8. The fail-safe programmable solid-state relay according to claim 6, wherein the display module displays a state of the at least one switching circuit, a level of the applied control voltage or current, remaining time in the at least one digital timer, an overall state of the relay, or any combination thereof.

9. The fail-safe programmable solid-state relay according to claim 8, wherein the applied control voltage or current is selected from DC or AC.

10. A fail-safe programmable solid-state relay comprising:

a base module;

a configuration module;

a control voltage module comprising at least one energy storage device;

a controller module having at least two electrically isolated microcontrollers operating in parallel, each microcontroller comprising an internal EEPROM memory and at least one digital timer; and at least one switch module comprising at least one switching circuit, wherein the at least one switching circuit has two switches:

wherein the control voltage module is adapted to receive an applied control voltage or current and to permit pre-selection of an activation voltage or current level and a de-activation voltage or current level;

wherein, when the applied control voltage or current exceeds the pre-selected activation voltage or current level, a response to a polarity of the applied control voltage or current is generated and the at least one switching circuit is set to at least one individually pre-determined first state and the at least one digital timer is loaded with a pre-determined value, whereafter the at least one digital timer is started to initiate at least one time delay, an expiry of which sets the at least one switching circuit to at least one individually pre-determined subsequent state;

wherein, when the applied control voltage or current decreases to the pre-selected de-activation voltage or current level, a response is generated whereby the at least one digital timer is started to initiate at least one time delay, an expiry of which sets the at least one switching circuit to at least one individually pre-determined subsequent state; and wherein the polarity of the applied control voltage or current is pre-selectable between polarity sensitive and polarity insensitive and wherein when the polarity is sensitive, a biased relay is provided and when the polarity is insensitive, an unbiased relay is provided.

11. A fail-safe programmable solid-state relay
Comprising;

a base module;

a configuration module;

a control voltage module comprising at least one energy storage device;

a controller module having at least two electrically isolated microcontrollers operating in parallel, each microcontroller comprising an internal EEPROM memory and at least one digital timer;

at least one switch module comprising at least one switching circuit; and a unique pin code installed in the base module, wherein each pin is received in a matching pattern of three receptacles provided in a suitably compatible plugboard, whereby installation of the relay into an incorrect plugboard is substantially prevented;

wherein the at least one switching circuit has two switches; and wherein the control voltage module is adapted to receive an applied control voltage or current and to permit pre-selection of an activation voltage or current level and a de-activation voltage or current level.

12. The fail-safe programmable solid-state relay according to claim 1, further comprising a delayed release function, wherein when the applied control voltage or current decreases to the selected de-activation voltage or current level, a resetting of the at least one switching circuit to individually pre-determined first states is delayed by corresponding pre-determined time values.

13. The fail-safe programmable solid-state relay according to claim 1, wherein at least one of the at least two microcontrollers further comprises an external communication device, whereby the relay transmits data to an external device or service.

14. The fail-safe programmable solid-state relay according to claim 1, further comprising a switch latching function, whereby a state of the at least one switching circuit, once established in the active state, is retained in the active state for an indefinite length of time or until specified pre-requisite conditions are satisfied.

15. The fail-safe programmable solid-state relay
a slave device, wherein the slave device is selected from a relay, a computer, a motor, a bell, or combinations thereof.

16. A method of installing the fail-safe programmable solid-state relay according to claim 1 in a signaling and switching application, comprising:

initially selecting at least two or more of the following variables:

(i) at least one pair of suitable connections on the base module to supply the control voltage or current;

(ii) a desired number and combination of normally open and normally closed switches;

(iii) a value of the activation voltage or current level;

(iv) a value of the de-activation voltage or current level;

(v) a sensitivity of the relay to a polarity of an activation voltage or current;

(vi) an ability of the at least one switching circuit to retain its existing state upon removal of the activation voltage or current; and/or (vii) a value of at least one time delay; and pre-setting one or more levels of the at least two selected variables prior to removably attaching the relay to a plugboard.

17. A method of operation using an installed software program of the fail-safe programmable solid-state relay according to claim 1 comprising the steps of: (i) reading and/or measuring an analog level of the applied control voltage or current and converting it into a digital value; (ii) periodically and continuously monitoring the digital value of the control voltage or current and comparing it to one or more pre-set levels of the control voltage or current; and (iii) modifying the the at least one switching circuit according to at least one of: i) the measured value of the activation control voltage or current as required; ii) an ability of the at least one switching circuit to retain its existing state upon removal of the activation voltage or current or when the activation or current voltage decreases below a minimum voltage or current level; and/or iii) an instantaneous value of any time delay, whereby an unsafe state of the relay is substantially prevented.

18. The fail-safe programmable solid-state relay according to claim 4, wherein the at least one switching circuit is placed in a state which is selected from at least one normally open switch, or at least one normally closed switch, or a combination thereof; and wherein determination of a state of the control voltage or current operates independently of a voltage or current of the at least one switching circuit.

19. The fail-safe programmable solid-state relay according to according to claim 18, wherein the state of the at least one switching circuit comprises at least two normally open switches connected in series.

20. The fail-safe programmable solid-state relay according to according to claim 18, wherein the state of the at least one switching circuit comprises at least two normally closed switches connected in parallel.

21. The fail-safe programmable solid-state relay according to claim 18, wherein the state of the at least one switching circuit comprises a first set of at least two normally closed switches connected in series being connected in parallel to a second set of at least two normally closed switches connected in series.

22. The fail-safe programmable solid-state relay according to according to claim 18, wherein the state of the at least one switching circuit is selected from one of: up to sixteen sets of two normally open switches in series; up to sixteen sets of two normally closed switches connected in parallel; and up to sixteen sets of a combination of two normally open switches in series and two normally closed switches in parallel.

* * * * *

UNITED STATES PATENT AND TRADEMARK OFFICE
CERTIFICATE OF CORRECTION

PATENT NO. : 10,672,578 B2
APPLICATION NO. : 15/754634
DATED : June 2, 2020
INVENTOR(S) : David Martin Stuckey et al.

Page 1 of 1

It is certified that error appears in the above-identified patent and that said Letters Patent is hereby corrected as shown below:

In the Claims

Column 21, Line 20, Claim 6, before "claim" insert -- to --

Column 21, Line 48, Claim 10, delete "switches:" and insert -- switches; --

Column 22, Line 11, Claim 11, delete "Comprising;" and insert -- comprising: --

Column 22, Line 51, Claim 15, delete "The fail-safe programmable solid-state relay" and insert -- A system comprising: the fail-safe programmable solid-state relay of claim 1; and --

Column 23, Line 16, Claim 17, delete "the the" and insert -- the --

Column 24, Lines 4-5, Claim 19, delete "according to according to" and insert -- according to --

Column 24, Lines 8-9, Claim 20, delete "according to according to" and insert -- according to --

Column 24, Lines 12-13, Claim 21, delete "according to according to" and insert -- according to --

Column 24, Lines 18-19, Claim 22, delete "according to according to" and insert -- according to --

Signed and Sealed this
Twenty-ninth Day of September, 2020

Andrei Iancu
*Director of the United States Patent and Trademark Office*